(12) United States Patent
Arai (10) Patent No.: US 9,372,408 B2
(45) Date of Patent: Jun. 21, 2016

(54) MASK PATTERN GENERATION METHOD (71) Applicant: CANON KABUSHIKI KAISHA, Toyko (JP)

(72) Inventor: Tadashi Arai, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/579,667

(22) Filed: Dec. 22, 2014

(65) Prior Publication Data

US 2015/0178431 A1    Jun. 25, 2015

(30) Foreign Application Priority Data

Dec. 25, 2013    (JP) .................................. 2013-267158

(51) Int. Cl.
*G06F 17/50*    (2006.01)
*G03F 7/30*    (2006.01)
*G03F 1/00*    (2012.01)

(52) U.S. Cl.
CPC ... *G03F 7/30* (2013.01); *G03F 1/00* (2013.01)

(58) Field of Classification Search
CPC .............................. G06F 17/5045; G03F 7/30
USPC ................................................ 716/55; 430/5
See application file for complete search history.

(56) References Cited

U.S. PATENT DOCUMENTS 7,987,435 B2 *    7/2011    Ogawa .................... G03F 1/144
                                                                716/51
2004/0205688 A1*   10/2004    Pierrat ................ G06F 17/5068
                                                                716/53

FOREIGN PATENT DOCUMENTS

JP    2005181636 A    7/2005
JP    2011095729 A    5/2011

OTHER PUBLICATIONS

Michael C. Smayling et. al., "Low k1 Logic Design using Gridded Design Rules" Proc. of SPIE vol. 6925 p. 69250B (2008).

* cited by examiner

*Primary Examiner* — Jack Chiang
*Assistant Examiner* — Brandon Bowers
(74) *Attorney, Agent, or Firm* — Canon USA, Inc. IP Division (57) ABSTRACT

A method for generating a pattern of a mask includes obtaining data of a plurality of polygons representing a plurality of pattern elements, grouping polygons which overlap or contact with each other among the plural polygons in one group, not setting an evaluation position for evaluating an image of a pattern of the one group on a line segment of sides which overlap or contact with each other among sides of the polygon of the one group, and setting an evaluation position at a portion except for the line segment, and repeating calculating the image of the pattern of the one group, evaluating the calculated image at the set evaluation position, and correcting the pattern based on a result of the evaluating, and generating the pattern of the mask based on a result of the repeating step.

14 Claims, 7 Drawing Sheets

Prior Art

FIG. 1A

Prior Art

FIG. 1B

Prior Art

MASK PATTERN GENERATION METHOD

BACKGROUND OF THE INVENTION

1. Field of the Invention

This invention relates to a mask pattern generation method.

2. Description of the Related Art

In a lithography technique in a process of manufacturing a semiconductor device, an exposure apparatus including an illumination optical system for illuminating a mask (a reticle) with light from a light source and a projection optical system for projecting an image of a pattern of a mask onto a substrate (e.g., a wafer) is used.

As a minimum size of a target pattern to be formed on the substrate becomes a size lower than the wavelength of the light from the light source to be used for exposure, when the mask pattern image is projected onto the substrate, unintended interactions occur between adjacent patterns. The interactions of the light from respective patterns in the mask cause formation of an unintended image of a shape different from the target pattern on the substrate. With the increase in the difference between the minimum size of the target pattern and the wavelength of the light source, the occurrence of the resolution failure of the pattern increases.

There has been known a method for performing an optical proximity correction (OPC) on the pattern of the mask to decrease such the resolution failure. In the OPC, in consideration of the effects on the image of the pattern due to the interactions of the light from adjacent patterns, a correction for changing the shape of the pattern of the mask is performed so that the image of the pattern is formed within a target range.

Japanese Patent Laid-Open No. 2011-095729 discloses performing Source Mask Optimization (SMO) which is optimization of both an illumination mode for illuminating the mask (a light intensity distribution on a pupil of the illumination optical system) and a shape of the pattern of the mask using a computer. Data of the pattern of the mask is represented by GDS format for example. A figure given by apexes of a polygon as a design value is treated as a parameter. In the SMO, an evaluation position of the image of the pattern is determined, an evaluation result at the evaluation position is fed back to the variable.

Japanese Patent Laid-Open No. 2005-181636 discloses that the pattern of the mask is treated as a parameter, and the evaluation position of the image of the pattern is set at a midpoint between two apexes of a polygon.

On the other hand, due to, for example, a reduction in the factor $k_1$, it has been becoming difficult to transfer a desired pattern onto a wafer with high fidelity using the conventional two-dimensional layout pattern (that extends in vertical and horizontal directions). Therefore, in recent years, a method for manufacturing a circuit pattern that is called the one-dimensional layout technique has been contrived as shown in Michael C. Smayling et. al., "Low k1 Logic Design using Gridded Design Rules" Proc. of SPIE Vol. 6925 p. 69250B (2008). According to the one-dimensional layout technique, a line and space (L/S) pattern based on a single pitch is formed. After that, a plurality of pattern elements such as a cut pattern, which has equal image dimensions, is transferred onto a same grid at a plurality of positions by an exposure. In this manner, a circuit pattern is fabricated by cutting the L/S pattern based on the single pitch, by the plurality of pattern elements. This method can not only reduce an exposed area compared to the conventional two-dimensional pattern, but also make resolution of the pattern technically easier.

In designing the cut pattern of the one-dimensional layout, due to design procedure, a plurality of pattern elements is arranged to overlap or contact with each other for cutting neighboring lines.

In the case that the polygons overlap or contact with each other, the evaluation position is also set on a side at which the polygons overlap or contact with each other by use of the method disclosed in Japanese Patent Laid-Open No. 2005-181636. However, this evaluation position is inappropriate for evaluating the image of the pattern. When calculation of the optimization is performed with setting the evaluation position like this, the calculation time becomes longer, and an inappropriate calculation result is output.

Figure 1A:
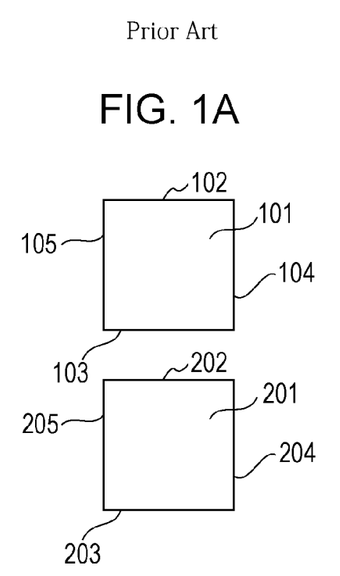
FIGS. 1A, 1B and 1C illustrate parameters and evaluation positions of polygons in a related art.
Figure 1B:
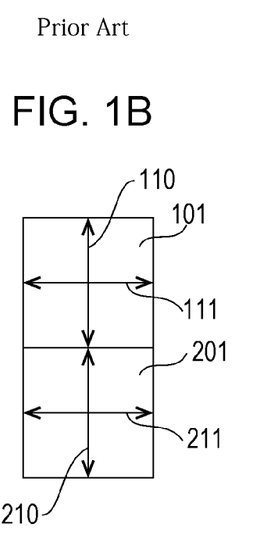
Figure 1C:
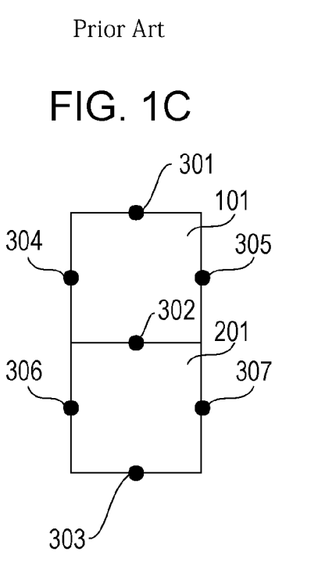

FIGS. 1A to 1C are examples of a case that the evaluation position or parameter is set by use of the method disclosed in Japanese Patent Laid-Open No. 2005-181636 when the polygons contact with each other. FIG. 1A shows respective sides (edges) of a polygon 101 and 201 as targets. A case that a lower side 103 of the polygon 101 contacts an upper side 202 of the polygon 201 as shown in FIG. 1B is described below.

FIG. 1B shows parameters of polygons. A parameter for adjusting width of the polygon 101 in the longitudinal direction is represented by a parameter 110 of width between an upper side 102 and a lower side 103. A parameter for adjusting width of the polygon 101 in the lateral direction is represented by a parameter 111 of width between a right side 104 and a left side 105. A parameter for adjusting width of the polygon 201 in the longitudinal direction is represented by a parameter 210 of width between an upper side 202 and a lower side 203. A parameter for adjusting width of the polygon 201 in the lateral direction is represented by a parameter 211 of width between a right side 204 and a left side 205.

The evaluation position is set at the center between apexes of each polygon. Therefore, evaluation positions 301 to 307 are set on respective sides of the polygons as shown in FIG. 1C. Here, an evaluation position 302 set on the side 103 (202) is focused. An image of the polygon 101 and the polygon 201 formed on the substrate (an image plane) is one successive image because the polygon 101 and the polygon 201 are contacted along the side 103 and the side 202. Therefore, it is impossible to calculate width of an image between the evaluation positions 301 and 302 and width of an image between the evaluation positions 302 and 303 when an imaging evaluation is performed. Hence, values of the parameters 110 or 210 become error. There may an issue when optimization calculation is performed, an optimized value of the parameter is not obtained.

SUMMARY OF THE INVENTION

According to the present invention, there is provided a method for generating a pattern of a mask used for exposing a substrate. The method includes obtaining data of a plurality of polygons representing a plurality of pattern elements, grouping polygons which overlap or contact with each other among the plural polygons in one group, not setting an evaluation position for evaluating an image of a pattern of the one group on a line segment of sides which overlap or contact with each other among sides of the polygon of the one group, and setting an evaluation position at a portion except for the line segment, and repeating calculating the image of the pattern of the one group, evaluating the calculated image at the set evaluation position, and correcting the pattern based on a result of the evaluating, and generating the pattern of the mask based on a result of the repeating step.

Further features of the present invention will become apparent from the following description of exemplary embodiments (with reference to the attached drawings).

DESCRIPTION OF THE EMBODIMENTS

The exemplary embodiments of the present invention can be applied to generate data of a pattern of a mask (an original) used during manufacturing of various kinds of devices, for example, a semiconductor chip such as an integrated circuit (IC) and a large-scale integration (LSI), a display element such as a liquid crystal panel, a detection element such as a magnetic head, and an image sensor such as a charge coupled device (CCD), and used in micromechanics.

Figure 2:
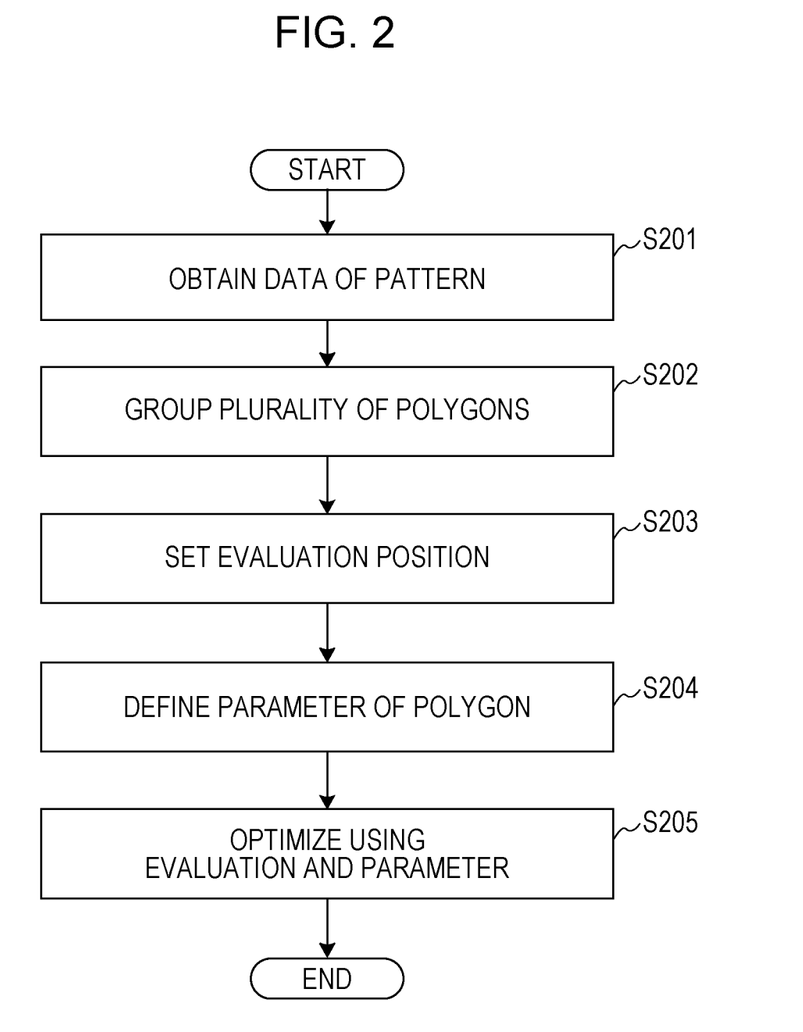
FIG. 2 is a flowchart of a method for generating a pattern of a mask according to the present embodiment.

A method for generating a pattern of a mask according to the exemplary embodiments of the present invention will be described. FIG. 2 is a flowchart illustrating the method for generating a pattern of a mask according to the exemplary embodiments of the present invention. The method according to the exemplary embodiment of the present invention is performed by an information processing apparatus such as a computer (a processor). The data of the pattern of the mask for use in an exposure apparatus that transfers the mask pattern onto a substrate by an exposure is generated. The exposure apparatus is not limited to an exposure apparatus that illuminates the mask and projects an image of the pattern of the mask onto the substrate using a projection optical system. The exposure apparatus can also be applied to a near-field exposure apparatus, and an exposure apparatus that exposes the substrate using an electron beam. For the electron beam exposure apparatus, this method can generate the data of the pattern to be formed on the substrate.

Figure 3A:
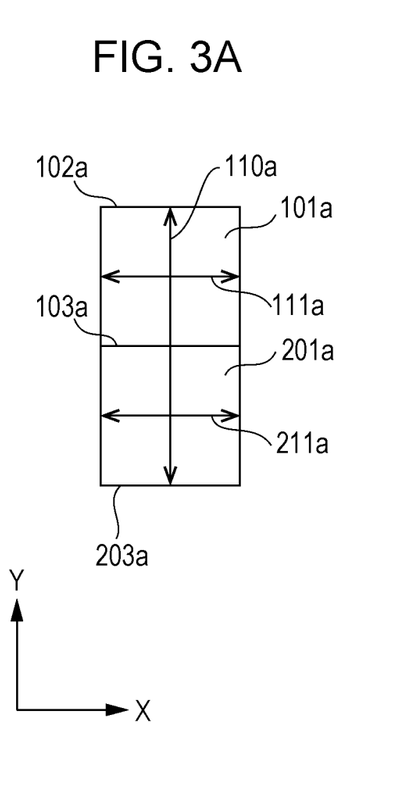
FIGS. 3A and 3B illustrate parameters and evaluation positions according to the present embodiment.

First, the computer obtains data of a designed pattern (S201). Data of a pattern for drawing on a mask blank is generally represented and memorized in data form of, for example, apex coordinate of a polygon such as Graphic Database System II (GDS II). The computer obtains the data of the polygon in this form. The pattern is typically a cut pattern used in one dimension layout technique which is includes a plurality of rectangular pattern elements independent with each other. However, the pattern is not limited to the one dimension layout technique. The pattern element is called a polygon in the following explanation. However, a shape of the pattern element is not limited to a polygon, can be applied to a circle defined by a curved line. In the present embodiment, an example of obtaining data of the polygons 101a and 201a contacting with each other as shown in FIG. 3A is explained. The polygons 101a and 201a are the same shape and same size.

Next, the computer groups polygons contacting or overlapping with each other (S202). The grouping means unifying a plurality of neighboring polygons to set a parameter unified in one group. Information of a group is represented by an identified number. A plurality of polygons grouped in one is numbered by common number. Here, the polygons 101a and 201a are contacting with each other, therefore, the polygons 101a and 201a are grouped in one group, the polygons 101a and 201a are numbered by number 1 as the information of the group.

Next, the computer sets an evaluation position based on the information of the group (S203). The evaluation position is a position for evaluating a dimension difference between an image of a pattern to be formed on a substrate (an optical image) and a designed pattern (a target value). The evaluation position is set at a position (a point) obtained using Wx' (constant) and X (constant) as follows. Wx' is a width of a designed polygon in an X direction obtained in the S201. The constant X is a center position of the designed polygon in the X direction.

An X-coordinate of an evaluation position on the left side: $X - Wx'/2$

An X-coordinate of an evaluation position on the right side: $X + Wx'/2$

Figure 3B:
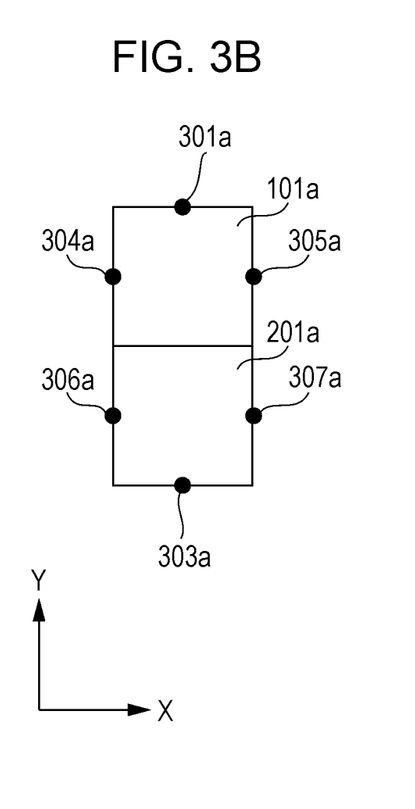

Concretely, evaluation positions 304a, 305a, 306a, 307a are set as shown in FIG. 3B. A dimension (width) of an image of a pattern in the X direction is obtained by obtaining points at the intersection of a contour of the image of the pattern comprising the polygons 101a and 201a with a straight line connecting the evaluation position 304a with the evaluation position 305a and calculating a distance between the points at the intersection. Further, a position shift of the image of the pattern in the X direction is obtained by calculating a center position between the points at the intersection. When the obtained dimension of the image or the obtained position shift is different from a target value, a value of the following parameter is changed.

Next, the computer defines a parameter of a polygon based on the information of the group (S204). Parameters Wx and Sx are set as parameters of the X direction. Wx is a parameter of a lateral width of a polygon corresponds to a distance between the evaluation positions 304a and 305a. Sx is a parameter of a center position shift of each polygon. The left side and the right side of a polygon are represented by these parameters using a center position X of a polygon (constant) as follows.

An X-coordinate of the left side: $X - Wx/2 + Sx$

An X-coordinate of the right side: $X + Wx/2 + Sx$

As well, the steps S203 and S204 are performed about a Y direction perpendicular to the X direction. Setting an evaluation position in the Y direction is described below. The computer sets an evaluation position for evaluating an image of a pattern constituting a group at a portion except for line segment contacting or overlapping with each other among sides of a polygon in the group. The polygons 101a and 201a are contacting with each other, therefore, the evaluation position is not set on a side 103a of a tangent line. Evaluation positions are set on the side 102a and the side 203a. Y1 (constant) is a designed center position of the polygon 101a obtained in the S201. Y2 (constant) is a center position of the polygon 201a. Wy' (constant) is a width of a designed polygon in the Y direction.

A Y-coordinate of an evaluation position 301a on a side 102a: $Y1 + Wy'/2$

A Y-coordinate of an evaluation position 303a on a side 203a: $Y1 + Wy'/2$

A dimension (width) of an image of a pattern in the Y direction is obtained by obtaining points at the intersection of a contour of the image of the pattern comprising the polygons 101a and 201a with a straight line connecting the evaluation position 301a with the evaluation positions 303a and calculating a distance between the points at the intersection. Also, a position shift of the image of the pattern in the Y direction is obtained by calculating a center position between the points at the intersection. A value of the following parameter is changed so that the obtained width of the image or the obtained position shift comes close to a target value.

A parameter Wy about longitudinal width of a polygon and a parameter Sy about a center position shift are set as parameters of the Y direction. A Y-coordinate of the upper side 102a of the polygon 101a is represented as follows.
The Y-coordinate of the upper side 102a: Y1+Wy/2+Sy A Y-coordinate of a lower side 203a of the polygon 201a is represented as follows.
The Y-coordinate of the lower side 203a: Y2−Wy/2+Sy The lower side 103a of the polygon 101a and an upper side 202a of the polygon 201a are represented using the constant width Wy' of a designed polygon without using a variable as follows.
A Y-coordinate of the side 103a: Y1−Wy'/2
A Y-coordinate of the side 202a: Y2+Wy'/2

The Y-coordinates of the sides 103a and 202a are constant. Therefore, these are unchangeably set as fixed even if the parameters Wy and Sy change. That is, a position of a side except for a side on which a plurality of polygons is contacting or overlapping with each other is variably set.

Finally, the computer optimizes using the above set evaluation positions and parameters (S205). In the optimization, the computer defines a pattern using a parameter, calculates an image of the pattern, evaluates the calculated image at the set evaluation position, and obtains the dimension or the position shift of the calculated image. Then, a step of correcting a pattern is repeated so that the obtained dimension or the position shift comes close to a target value based on the evaluation result. And then, the computer determines a pattern of a mask based on the result of the repeating process. In the process of correcting the pattern, a position of a side except for a side on which a plurality of polygons contacts or overlaps with each other is changed to deform the polygon by changing values of the above parameters. Also, an auxiliary pattern not to be resolved can be added or deformed. As a reference for determining a pattern, a pattern is determined when an optimized value is obtained among evaluation results obtained by calculating the repeating up to a predetermine number of times. As well, a pattern is determined when an evaluation value is more than a predetermined value or is within an allowable range.

[First Embodiment]

Next, steps 202 to 205 are described in detail using a concrete embodiment.

Figure 4:
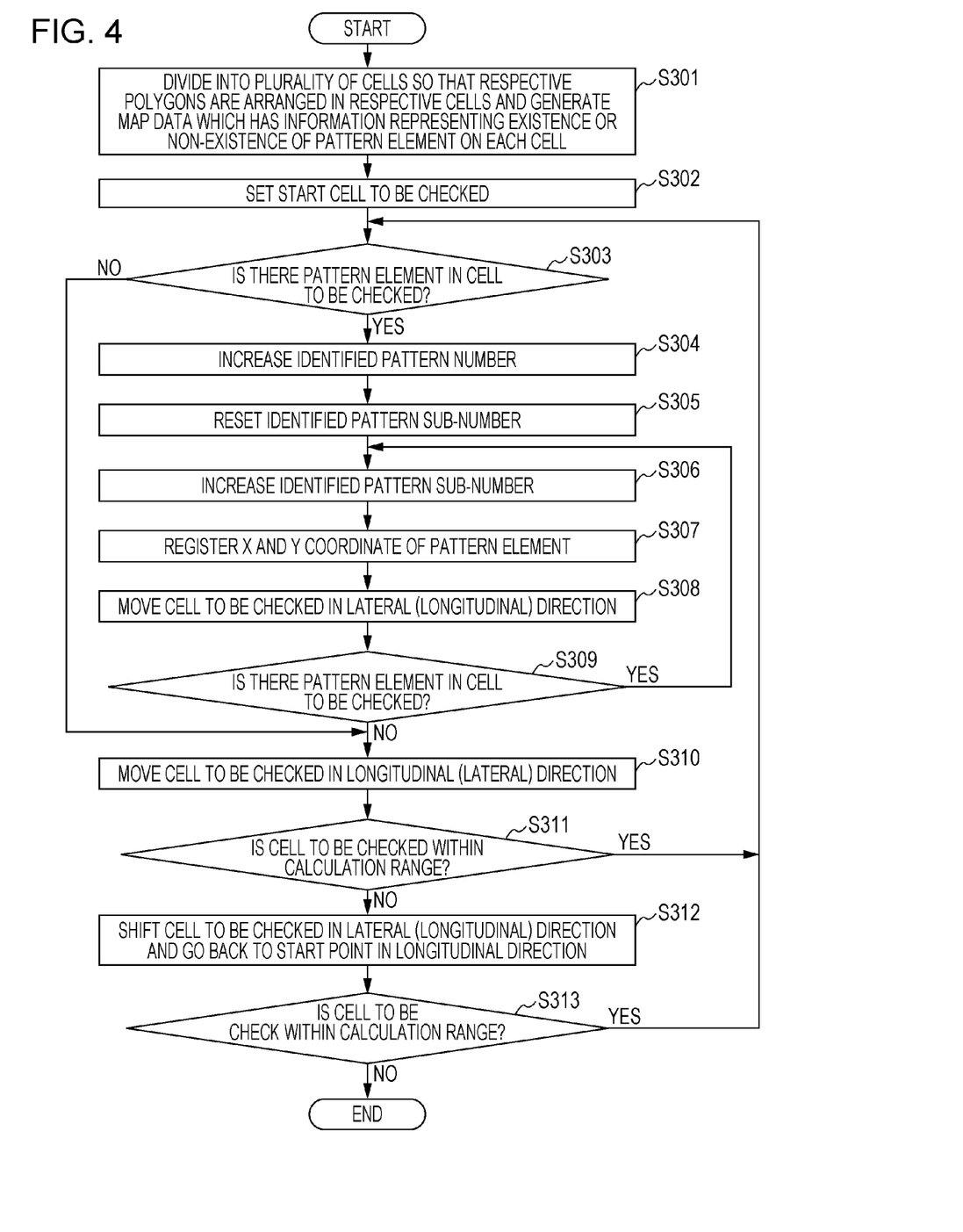
FIG. 4 is a detail flowchart of grouping in the step 202.

First, FIG. 4 illustrates a detail flow of the step 202 of grouping a plurality of polygons. Here, data of a plurality of pattern elements 401a to 401f represented by polygons is obtained. The each pattern element has the same shape.

Figure 5A:
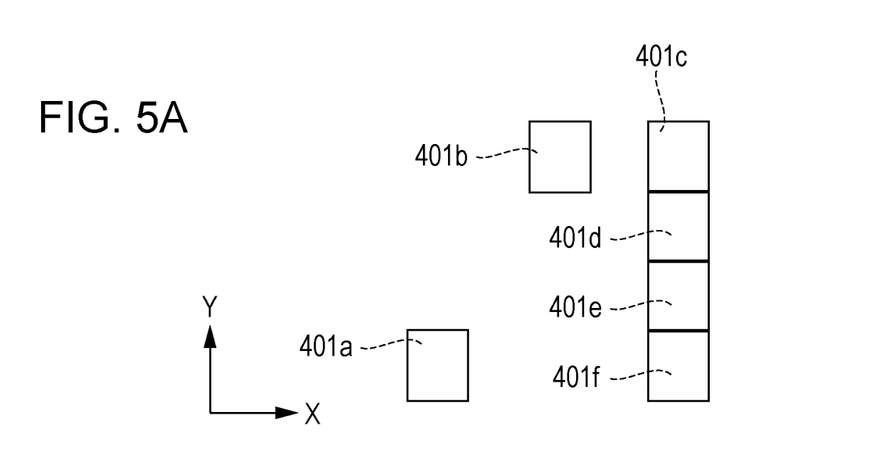
FIGS. 5A, 5B, and 5C illustrate grouping using map data according to the first embodiment.
Figure 5B:
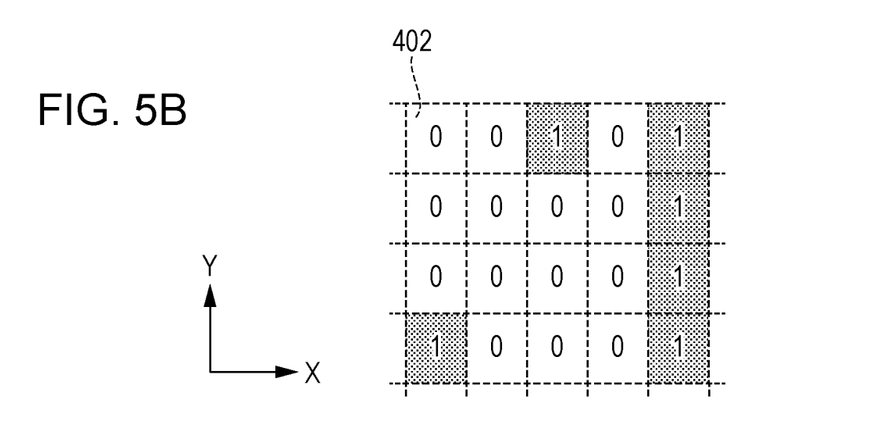
Figure 5C:
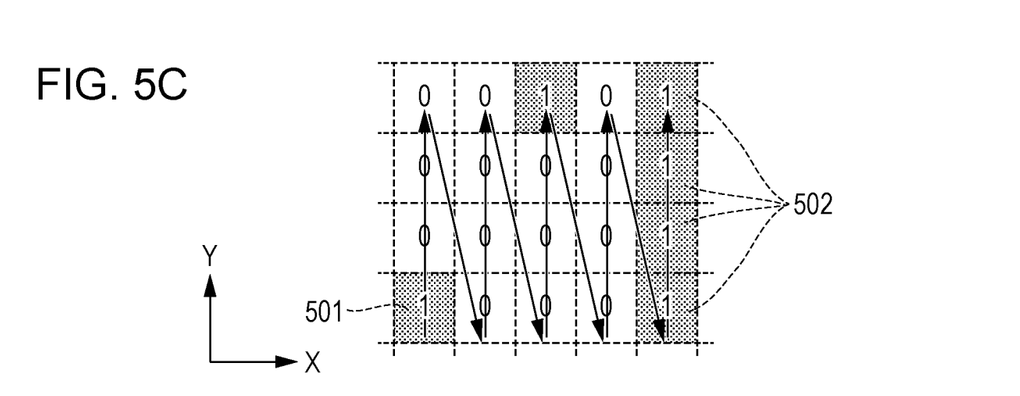

A step 301 (S301) is a process of converting data provided by the form such as GDS II into map data in the form of cell. An example of map data is shown in FIG. 5B. A region of a pattern is divided into a plurality of cells 402 at equal intervals so that respective pattern elements 401a to 401f are arranged in respective cells 402. Then, a cell in which a pattern element exists is numbered at 1, and a cell in which a pattern element does not exist is numbered at 0 on respective cells 402. When each pattern element of a cut pattern is designed on the cell at equal interval based on a grid design rule, respective pattern elements 401a to 401f correspond one-to-one to respective cells partitioned at equal interval. Thus, the data of the pattern is converted into the map data which has information representing existence or non-existence of the pattern element on each cell. Moreover, shape of each cell is not limited to rectangular shape. If each pattern element corresponds to each cell, any shape of the cell is applicable.

Next, the computer determines a start cell from which check is started (S302). For example, the start cell is set at a lower left position numbered by 501 in FIG. 5. Next, the computer checks whether there is a pattern element in a cell or not (S303). A pattern element exists if data of a cell is 1, a pattern element does not exist if data of a cell is 0.

If a pattern element exists in a cell, next, an identified pattern number is increased (S304). At first, for example, the identified pattern number is 0, the identified pattern number is increased by performing this step. Next, an identified pattern sub-number of a pattern element is reset (S305). The identified pattern sub-number is a number for further classifying pattern elements having the same identified pattern number as the same group. In this case, the identified pattern sub-number is used to distinguish neighboring pattern elements from each other. Next, the identified pattern sub-number is increased (S306). The identified pattern sub-number of a pattern element is increased as long as pattern elements continue in series.

Next, a center position coordinate (x, y) of a pattern element in the X direction and Y direction is registered in a memory (a storage unit) about a cell having the pattern element (S307). Next, a cell to be checked is moved in a longitudinal direction or lateral direction (S308). Here, neighboring pattern elements as 502 continue in the longitudinal direction or lateral direction, thereby the cell to be checked is moved in the longitudinal direction when the pattern elements are neighboring in the longitudinal direction, and the cell to be checked is moved in the lateral direction when the pattern elements are neighboring in the lateral direction.

Again, the computer checks whether there is a pattern element in a cell in which the cell to be checked moves or not (S309). If there is a pattern element in the cell, a process goes back to the S306. When the pattern elements are neighboring in the longitudinal direction, the process goes back to the step S306 from the step S309. Therefore, a plurality of center positions are registered for the identified pattern sub-numbers in regard to the same identified pattern number. Being the same identified pattern number represents a group. In the step S309, when the computer determines that there is not a pattern element in the cell to be checked, a process goes back to the step S310. The computer groups to identify neighboring pattern elements as the same identified pattern number and sets continued cells having information of polygons into one group by performing the above process.

The cell to be checked is laterally or longitudinally moved to repeat this process in entire data of cells (S310). A check that whether the cell to be checked is within a calculation rage or not is performed (S311). If the cell to be checked is without the calculation rage, a movement direction is changed to lateral one from longitudinal one or to longitudinal one from lateral one. The cell to be checked goes back to a start point in the longitudinal or lateral direction (S312). Then, the computer checks whether the cell to be checked in which the cell to be checked moves is within the calculation rage or not (S313). If the cell is within the calculation rage, a process goes back to the S303, and the above-mentioned same process is repeated about all cells.

Information about each pattern element is registered in the memory by these calculation processes. A center position of the lower left cell shown in FIG. 5B is as the origin (0, 0). One cell is 100 nm width in the longitudinal and lateral direction. Center position coordinate group of each pattern element are defined as X(the identified pattern number, the identified pattern sub-number), Y(the identified pattern number, the identified pattern sub-number). A pattern element 401b is described as below.

X (1, 1)=200 [nm] , Y (1, 1)=300 [nm]

In the same manner, pattern elements 401c to 401f are grouped in the same identified pattern number and are registered as below.

401f: X (2, 1)=400 [nm], Y (2, 1)=0 [nm]
401e: X (2, 2)=400 [nm], Y (2, 2)=100 [nm]
401d: X (2, 3)=400 [nm], Y (2, 3)=200 [nm]
401c: X (2, 4)=400 [nm], Y (2, 4)=300 [nm]

Figure 6A:
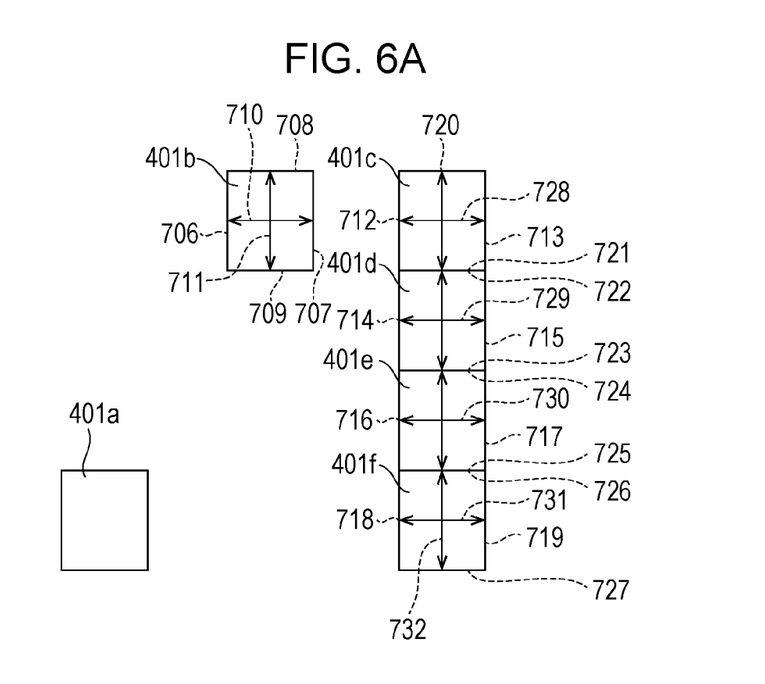
FIGS. 6A and 6B illustrate parameters and evaluation positions according to the first embodiment.
Figure 6B:
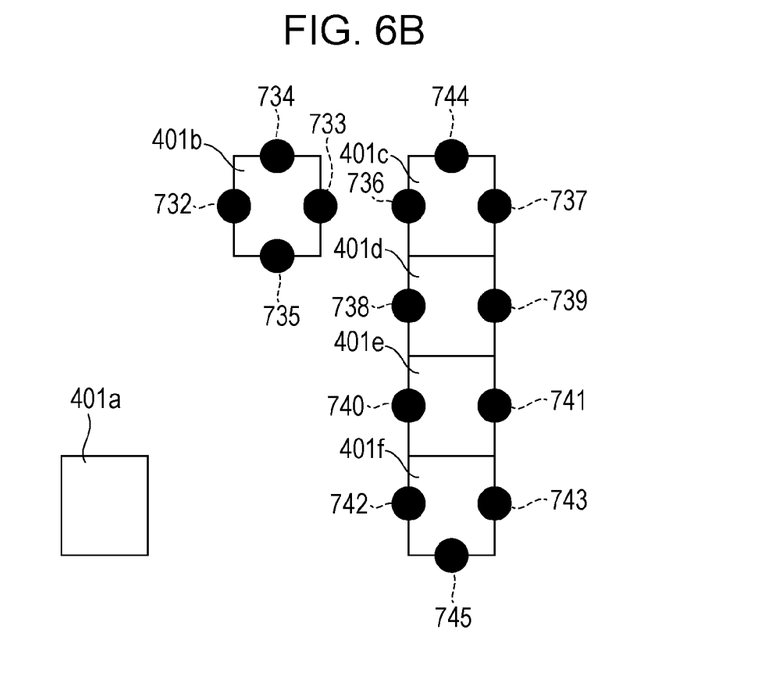

Next, a step S203 of setting an evaluation position for evaluating dimension or position shift of an image based on the group is described below. The pattern element 401b is distinguished as one group alone. In this case, evaluation positions 732 and 733 for evaluating dimension of an image in a lateral direction are set on sides 706 and 707, and evaluation positions 734 and 735 for evaluating dimension of an image in a longitudinal direction are set on sides 708 and 709 as shown in FIGS. 6A and 6B. Respective evaluation positions are set using a design width Wx' in the X direction and a design width Wy' in the Y direction and a center position of the pattern element 401b as below.

An X-coordinate of the evaluation position 732: $X(1,1)-Wx'/2$
A Y-coordinate of the evaluation position 732: $Y(1,1)$
An X-coordinate of the evaluation position 733: $X(1,1)+Wx'/2$
A Y-coordinate of the evaluation position 733: $Y(1,1)$
An X-coordinate of the evaluation position 734: $X(1,1)$
A Y-coordinate of the evaluation position 734: $Y(1,1)+Wy'/2$
An X-coordinate of the evaluation position 735: $X(1,1)$
A Y-coordinate of the evaluation position 735: $Y(1,1)-Wy'/2$ Pattern elements 401c to 401f are grouped in one group. Center positions of respective pattern elements are registered with one identified pattern number in the memory. About the lateral direction, evaluation positions 736 and 737 for evaluating dimension of an image of a pattern in the lateral direction are set on sides 712 and 713 corresponding to the pattern element 401c. As well, evaluation positions 738 and 739 for evaluating dimension of an image of a pattern in the lateral direction are set on sides 714 and 715 corresponding to the pattern element 401d. Evaluation positions 740 and 741 for evaluating dimension of an image of a pattern in the lateral direction are set on sides 716 and 717 corresponding to the pattern element 401e. Evaluation positions 742 and 743 for evaluating dimension of an image of a pattern in the lateral direction are set on sides 718 and 719 corresponding to the pattern element 401f.

Respective evaluation positions are set using a design width Wx' in the X direction and a design width Wy' in the Y direction of a pattern element (a polygon) and the above center position coordinate group as below.

An X-coordinate of the evaluation position 736: $X(2,4)-Wx'/2$
A Y-coordinate of the evaluation position 736: $Y(2,4)$
An X-coordinate of the evaluation position 737: $X(2,4)+Wx'/2$
A Y-coordinate of the evaluation position 737: $Y(2,4)$
An X-coordinate of the evaluation position 738: $X(2,3)-Wx'/2$
A Y-coordinate of the evaluation position 738: $Y(2,3)$
An X-coordinate of the evaluation position 739: $X(2,3)+Wx'/2$
A Y-coordinate of the evaluation position 739: $Y(2,3)$
An X-coordinate of the evaluation position 740: $X(2,2)-Wx'/2$
A Y-coordinate of the evaluation position 740: $Y(2,2)$
An X-coordinate of the evaluation position 741: $X(2,2)+Wx'/2$
A Y-coordinate of the evaluation position 741: $Y(2,2)$
An X-coordinate of the evaluation position 742: $X(2,1)-Wx'/2$
A Y-coordinate of the evaluation position 742: $Y(2,1)$
An X-coordinate of the evaluation position 743: $X(2,1)+Wx'/2$
A Y-coordinate of the evaluation position 743: $Y(2,1)$ On the other hand, about the longitudinal direction, any evaluation position is not set on sides 721 to 726 because the pattern elements 401c to 401f contact with each other. Here, evaluation positions 744 and 745 for evaluating dimension of an image of a pattern in the longitudinal direction are set on sides 720 and 727. It is possible to avoid setting the vain evaluation position which has a bad effect by grouping in this manner. Here, evaluation positions 744 and 745 are set using a design width Wx' in the X direction and a design width Wy' in the Y direction and center position coordinate group of pattern elements 401f and 401c as below.

An X-coordinate of the evaluation position 744: $X(2,4)$
An Y-coordinate of the evaluation position 744: $Y(2,4)+Wy'/2$
An X-coordinate of the evaluation position 745: $X(2,1)$
An Y-coordinate of the evaluation position 745: $Y(2,1)-Wy'/2$ Next, a step S204 of defining a parameter based on a group is described below. About the pattern element 401b, a parameter Wx1 710 for moving a left side 706 and a right side 707 to the lateral direction and a parameter Wy1 711 for moving an upper side 708 and a lower side 709 to the longitudinal direction are set. Also, center position shift Sx1 in the lateral direction and center position shift Sy1 in the longitudinal direction are set.

X-coordinates of the sides 706 and 707 are represented using the parameter Wx1, Sx1 and center position coordinate of the pattern element 401b as below.
The X-coordinate of the side 706: $X(1,1)-Wx/2+Sx1$
The X-coordinate of the side 707: $X(1,1)+Wx/2+Sx1$ Y-coordinates of the sides 708 and 709 are represented using the parameter Wy1, Sy1 and center position coordinate of the pattern element 401b as below.
The Y-coordinate of the side 708: $Y(1,1)+Wy1/2+Sy1$
The Y-coordinate of the side 709: $Y(1,1)-Wy1/2+Sy1$ Next, parameters about a plurality of pattern elements 401c to 401f are described below. About the lateral direction, a parameter Wx2 728 for moving sides 712 and 713 is set corresponding to the pattern element 401c. As well, a parameter Wx3 729 for moving sides 714 and 715 is set corresponding to the pattern element 401d. A parameter Wx4 730 for moving sides 716 and 717 is set corresponding to the pattern element 401e. A parameter Wx5 731 for moving sides 718 and 719 is set corresponding to the pattern element 401f. Center position shift parameters Sx1 to Sx5 of the pattern elements 401c to 401f in the lateral direction are set.

Positions of respective sides are represented using the parameters Wx2 to Wx5, Sx2 to Sx5, and center position coordinates of respective pattern elements as below.

An X-coordinate of the side 712: $X(2,4)-Wx2/2+Sx2$
An X-coordinate of the side 713: $X(2,4)-Wx2/2+Sx2$
An X-coordinate of the side 714: $X(2,3)-Wx3/2+Sx3$
An X-coordinate of the side 715: $X(2,3)-Wx3/2+Sx3$ An X-coordinate of the side 716: X(2,2)−Wx4/2+Sx4
An X-coordinate of the side 717: X(2,2)−Wx4/2+Sx4
An X-coordinate of the side 718: X(2,1)−Wx5/2+Sx5
An X-coordinate of the side 719: X(2,1)−Wx5/2+Sx5

On the other hand, about the longitudinal direction, a direction of a side is different from sides 721 to 726 on which polygons contact with each other. Typically, a position in vertical longitudinal direction is set without setting a variable. However, a parameter 732 for moving sides 702 and 727 is set. Therefore, it is possible to avoid generating a vain parameter which has a bad effect by grouping like this. As parameters, a parameter Wy2 of dimension of the pattern element 401$c$ in the lateral direction and a center position shift Sy2 in the longitudinal direction are set. Also, a parameter Wy5 of dimension of the pattern element 401$f$ in the longitudinal direction and a center position shift Sy5 in the longitudinal direction are set.

Positions (variables) of sides 720 and 727 are represented using the parameter Wx2, Wy5, Sy2, Sy5 and center position coordinate of each pattern element as below.
The Y-coordinate of the side 720: Y(2,4)+Wy2/2+Sy2
The Y-coordinate of the side 727: Y(2,1)−Wy5/2+Sy5

Positions (constant) of sides 721 to 726 are represented using center position coordinates of the pattern elements 401$d$ to 401$f$ in the longitudinal direction and a designed dimension Wy' in the longitudinal direction as below.
The Y-coordinate of the side 721: Y(2,4)−Wy'/2
The Y-coordinate of the side 722: Y(2,3)+Wy'/2
The Y-coordinate of the side 723: Y(2,3)−Wy'/2
The Y-coordinate of the side 724: Y(2,2)+Wy'/2
The Y-coordinate of the side 725: Y(2,2)−Wy'/2
The Y-coordinate of the side 726: Y(2,1)+Wy'/2

A method of converting polygon data into map data in the form of cell is described in the step S301. However, the computer not necessarily has to convert into map data in the form of cell. For example, a method, such as grouping polygons using discriminant for determining whether apexes are within inside of polygons on each other or not, can be applied. It is possible to set an evaluation position in a portion except for line segments overlapping with each other when polygons overlap with each other.

Figure 7:
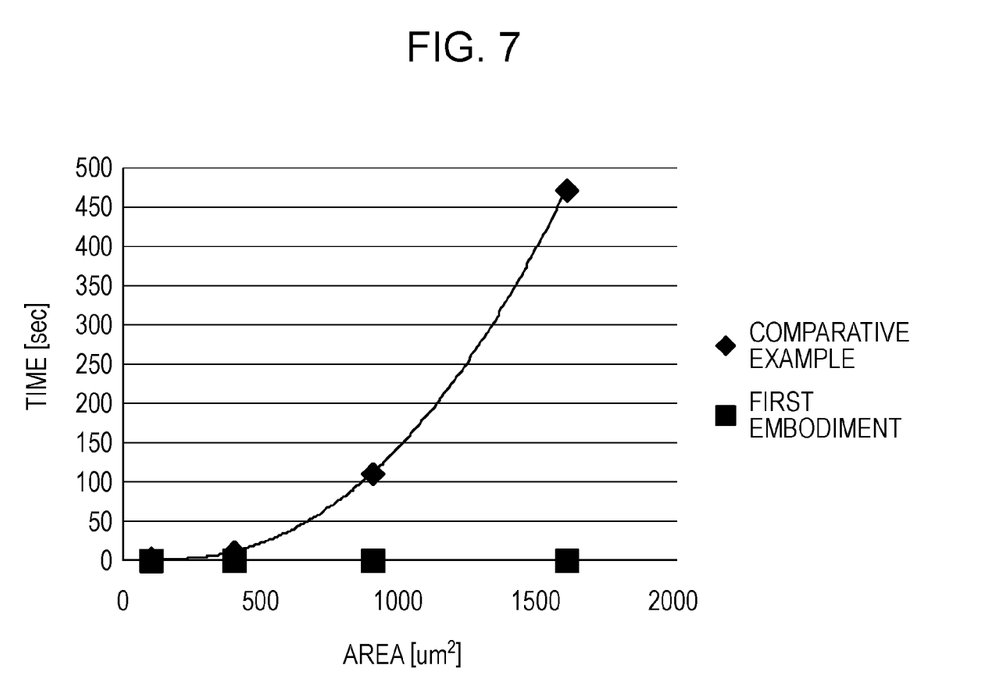
FIG. 7 illustrates an effect of a method for converting data of a polygon into map data in the form of cell and grouping the data.

Effect of the method of converting polygon data into map data in the form of cell in the step S301 is described. When patterns designed by a grid design rule of one dimension layout are grouped, and a parameter and an evaluation position are set, calculation time for processes is decreased. The effect is shown in FIG. 7. A point shown as comparative example in the graph represents calculation time for grouping when discriminating whether sides of polygons overlap or contact with each other is performed by comparing position coordinates of respective sides. For example, the comparative example takes 470 seconds to group a pattern of 90 nm node device in 1600 um$^2$ area. However, it takes only 0.24 seconds to group a pattern of 90 nm node device in 1600 um$^2$ area by the method for converting into map data in the form of cell in the present embodiment. The present embodiment performs about 2000 times faster process than the comparative example. There is a plurality of methods of grouping. When a grid design rule is applicable, it is understood that the method for converting into map data in the form of cell is faster.

Above mentioned, it is possible to avoid generating a vain evaluation or parameter which has a bad effect by grouping a plurality of polygons. Therefore, calculation error is decreased by optimizing a pattern of a mask using a set evaluation and parameter. Then, the pattern of the mask can be generated.

Data of the pattern of the mask generated as above is converted in accordance with data format input in a mask manufacturing apparatus (a drawing apparatus). Then, the converted data is input in the mask manufacturing apparatus. Then, the mask manufacturing apparatus draws a pattern on a mask blank based on the input data to manufacture a mask. The manufactured mask is transferred to a projection exposure apparatus. The projection exposure apparatus illuminates the manufactured mask on a set condition and projects an image of a pattern of the mask onto photosensitive agent. (resist) on a substrate to expose the photosensitive agent. In case of an electron beam exposure apparatus, a position of an electron beam or blanking is controlled using data of the generated mask pattern, a substrate is exposed by a pattern.

Next, a method for manufacturing a device (ex., a liquid crystal display device) is described. The liquid crystal display device is manufactured through a process of forming a transparent electrode. The process of forming a transparent electrode includes a step of applying a photosensitive agent to a glass substrate on which a transparent conductive film is deposited, a step of arranging the mask manufactured as above in the exposure apparatus and exposing the glass substrate coated with the photosensitive agent, and a step of developing the glass substrate.

A method of manufacturing a device using the exposure apparatus described above is suitable for manufacturing such as a semiconductor device except for a liquid crystal display device. The method includes a step of arranging the mask manufactured as above in the exposure apparatus and exposing the substrate coated with the photosensitive agent, and a step of developing the exposed substrate. Further, the method of manufacturing a device includes the known processes (such as oxidation, a film formation, deposition, doping, planarization, etching, a resist removal, dicing, bonding, and packaging).

Having described exemplary embodiments of the present invention, it should be apparent that the present invention is not limited to these exemplary embodiments, and can be modified and changed in various manners within the scope of the invention.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No.2013-267158, filed Dec. 25, 2013, which is hereby incorporated by reference herein in its entirety.

What is claimed is:

1. A method for generating a pattern of a mask used for a mask manufacturing method for manufacturing the mask using data of the generated pattern of the mask, the method comprising the following steps performed by a processor:
obtaining data of a plurality of polygonal pattern elements;
grouping polygonal pattern elements which overlap or contact with each other among the plurality of polygon pattern elements in one group;
setting an evaluation position for evaluating an image of the polygonal pattern elements of the one group on a side except for sides which overlap or contact with each other among sides of the polygonal pattern elements of the one group;
calculating the image of the polygonal pattern elements of the one group;
evaluating the calculated image at the set evaluation position;
correcting the polygonal pattern element based on a result of the evaluating; and
generating the pattern of the mask including the corrected polygonal pattern element,
wherein the mask manufacturing method comprises a step of manufacturing the mask including the generated pattern using data of the generated pattern, and
wherein the corrected polygonal pattern element of the manufactured mask are resolved on a substrate.

2. The method according to claim 1, wherein the evaluation position is a position for evaluating the image in a direction different from a direction of sides which overlap or contact with each other among sides of the polygonal pattern elements of the one group.

3. The method according to claim 2, wherein the evaluation position is a position for evaluating the image in a direction perpendicular to a direction of sides which overlap or contact with each other among sides of the polygonal pattern element of the one group.

4. The method according to claim 1, wherein, the setting includes setting the evaluation position using a center position and width of the polygonal pattern element.

5. The method according to claim 1, wherein the setting includes
dividing into a plurality of cells so that respective polygonal pattern elements are arranged in respective cells using data of the obtained plurality of polygonal pattern elements,
generating map data which has information representing existence or non-existence of the polygonal pattern element on each cell, and
setting continued cells having information of polygonal pattern elements into one group using the map data.

6. The method according to claim 1, further comprising:
fixing positions of sides which overlap or contact with each other among sides of the polygonal pattern elements of the one group, and setting a position of a side except for the overlapping or contacting sides changeable,
wherein, after changing a position of a side except for the overlapping or contacting sides based on the result of the evaluating, the calculating, the evaluating and the correcting is performed.

7. The method according to claim 6, further comprising:
setting a center position and width of the polygonal pattern element as parameters,
wherein, in the changing, a position of a side except for the overlapping or contacting sides is changed by changing values of the parameters.

8. The method according to claim 1, wherein evaluating the calculated image at the set evaluation position is performed by obtaining a dimension or a position shift of the image from points at an intersection of a contour of the calculated image with a line connecting the evaluation positions.

9. The method according to claim 1, wherein the plurality of polygonal pattern elements includes rectangular pattern element for cutting or connecting a line and space pattern.

10. A non-transitory recording medium recording a program that causes a computer to execute the generation method according to claim 1.

11. A mask manufacturing method comprising:
generating data on a pattern of a mask by the method according to claim 1; and
manufacturing the mask using the generated data on the mask pattern.

12. An exposure method comprising:
manufacturing a mask by the method according to claim 11; and
exposing a substrate by projecting an image of a pattern of the manufactured mask onto the substrate.

13. A method of manufacturing a device, the method comprising:
exposing a substrate by using an exposure method according to claim 12; and
developing the exposed substrate.

14. An information apparatus comprising:
a processor configured to generate a pattern of a mask used for a mask manufacturing method for manufacturing the mask using data of the generated pattern of the mask,
wherein the processor
obtains data of a plurality of polygonal pattern elements,
groups polygonal pattern elements which overlap or contact with each other among the plurality of polygonal pattern elements in one group, setting an evaluation position for evaluating an image of the polygonal pattern elements of the one group on a side except for sides which overlap or contact with each other among sides of the polygonal pattern elements of the one group,
calculates the image of the polygonal pattern elements of the one group,
evaluates the calculated image at the set evaluation position, and
corrects the polygonal pattern element based on a result of the evaluating, and
generates the pattern of the mask including the corrected polygonal pattern element,
wherein the mask manufacturing method comprises a step of manufacturing the mask including the generated pattern using data of the generated pattern, and
wherein the corrected polygonal pattern element of the manufactured mask are resolved on a substrate.

* * * * *